(12) United States Patent
Cheng et al.

(10) Patent No.: US 12,132,120 B2
(45) Date of Patent: Oct. 29, 2024

(54) THIN FILM TRANSISTOR AND DISPLAY PANEL

(71) Applicant: WUHAN CHINA STAR OPTOELECTRONICS TECHNOLOGY CO., LTD., Wuhan (CN)

(72) Inventors: Hong Cheng, Wuhan (CN); Chao Tian, Wuhan (CN); Yanqing Guan, Wuhan (CN); Guanghui Liu, Wuhan (CN)

(*) Notice: Subject to any disclaimer, the term of this patent is extended or adjusted under 35 U.S.C. 154(b) by 0 days.

(21) Appl. No.: 17/598,275

(22) PCT Filed: Aug. 6, 2021

(86) PCT No.: PCT/CN2021/111220
§ 371 (c)(1),
(2) Date: Sep. 26, 2021

(87) PCT Pub. No.: WO2023/004875
PCT Pub. Date: Feb. 2, 2023

(65) Prior Publication Data
US 2024/0055535 A1    Feb. 15, 2024

(30) Foreign Application Priority Data
Jul. 27, 2021 (CN) .......................... 202110852025.4

(51) Int. Cl.
*H01L 29/786* (2006.01)
*H01L 29/423* (2006.01)
(Continued)

(52) U.S. Cl.
CPC .................. *H01L 29/78696* (2013.01); *H01L 29/42384* (2013.01); *G02F 1/1368* (2013.01); *H10K 59/1213* (2023.02)

(58) Field of Classification Search
CPC ......... H01L 29/78696; H01L 29/42384; H01L 29/78675; H01L 29/0607; H01L 29/0684;
(Continued)

(56) References Cited

U.S. PATENT DOCUMENTS 6,025,607 A    2/2000 Ohori
2004/0089862 A1    5/2004 Kimura
(Continued)

FOREIGN PATENT DOCUMENTS

CN    1719508 A    1/2006
CN    105206216 A    12/2015
CN    111710728 A    9/2020

OTHER PUBLICATIONS

International Search Report in International application No. PCT/CN2021/111220, mailed on Apr. 26, 2022.
(Continued)

*Primary Examiner* — Tong-Ho Kim (57) ABSTRACT

A thin film transistor and a display panel are provided. A first dimension of a first transmission portion electrically connected to a source heavily-doped portion is different from a second dimension of a second transmission portion electrically connected to a drain heavily-doped portion, so that an intensity of an electric field of carriers transmitted by the transmission portion corresponding to the larger one of the first dimension or the second dimension is smaller when the thin film transistor is turned on, thereby reducing the bombardment effect of the carriers on a source or a drain and improving the stability of thin film transistor.

14 Claims, 4 Drawing Sheets

(51) Int. Cl.
*G02F 1/1368* (2006.01)
*H10K 59/121* (2023.01)

(58) Field of Classification Search
CPC .......... H01L 29/1033; H01L 29/42372; H01L 29/7869; G02F 1/1368; H10K 59/1213
USPC ......................................................... 257/72
See application file for complete search history.

(56) References Cited

U.S. PATENT DOCUMENTS

2007/0051956 A1* 3/2007 Shih .................. H01L 29/78645
257/E29.279
2009/0321742 A1* 12/2009 Hsu .................... H01L 29/78645
257/66

OTHER PUBLICATIONS

Written Opinion of the International Search Authority in International application No. PCT/CN2021/111220, mailed on Apr. 26, 2022.

* cited by examiner

THIN FILM TRANSISTOR AND DISPLAY PANEL

FIELD OF INVENTION

This disclosure relates to a field of display technology, and more particularly, to a thin film transistor and a display panel.

BACKGROUND OF INVENTION

Currently, thin film transistors with dual channels cannot properly operate when continuously subjected to bias stress, thereby being disadvantage to the stability of the thin film transistors with dual channels.

Therefore, it is necessary to provide a technical solution to solve the problem that thin film transistors with dual channels continuously subjected to bias stress tend to fail.

SUMMARY OF INVENTION

Technical Problem

An object of the disclosure is to provide a thin film transistor and a display panel, so as to solve the problem that the thin film transistor with dual channels is continuously subjected to bias stress and fails.

Technical Solutions

The disclosure provides a thin film transistor. The thin film transistor comprises:
- a gate pattern comprising a first gate and a second gate, the first gate is spaced from the second gate and the first gate and the second gate are electrically connected to each other; and
- an active pattern.

The active pattern comprises:
- a source heavily-doped portion;
- a first transmission portion electrically connected to the source heavily-doped portion and at least partially overlapping the first gate, the first transmission portion has a first dimension in a direction of the first transmission portion towards the source heavily-doped portion;
- a drain heavily-doped portion; and
- a second transmission portion electrically connected to the drain heavily-doped portion and at least partially overlapping the second gate, the second transmission portion has a second dimension in a direction of the second transmission portion towards the drain heavily-doped portion.

The first transmission portion and the second transmission portion are both disposed between the source heavily-doped portion and the drain heavily-doped portion, the first transmission portion is spaced from the second transmission portion, and the first dimension is different from the second dimension.

The disclosure further provides a display panel comprising the thin film transistor mentioned-above.

Beneficial Effects:

The application provides a thin film transistor and a display panel. The first dimension of the first transmission portion electrically connected to the source heavily-doped portion is different from the second dimension of the second transmission portion electrically connected to the drain heavily-doped portion. The first dimension is a dimension of the first transmission portion in a direction of the first transmission portion directing towards the source heavily-doped portion, and the second dimension is a dimension of the second transmission portion in a direction of the second transmission portion directing towards the drain heavily-doped portion. Therefore, when the thin film transistor is turned on, carriers transmitted by the transmission portion corresponding to the larger one of the first dimension or the second dimension is subjected to smaller intensity of the electric field. The bombardment effect of the carriers on the source or drain is reduced, thereby improving the damage of the bias stress to the source or drain, and improving the stability of the thin film transistor.

DESCRIPTION OF DRAWINGS

In order to more clearly illustrate the embodiments of the disclosure or the technical solutions in the prior art, the following briefly introduces the accompanying drawings used in the embodiments. Obviously, the drawings in the following description merely show some of the embodiments of the disclosure. As regards one of ordinary skill in the art, other drawings can be obtained in accordance with these accompanying drawings without making creative efforts.

DETAILED DESCRIPTION OF PREFERRED EMBODIMENTS

The technical solutions in the embodiments of the disclosure will be described clearly and completely below with reference to the drawings in the embodiments of the disclosure. Obviously, the described embodiments are only a part of the embodiments of the disclosure, but not all the embodiments. Based on the embodiments in the disclosure, all other embodiments obtained by those skilled in the art without creative efforts fall within the scope of the disclosure.

Figure 1:
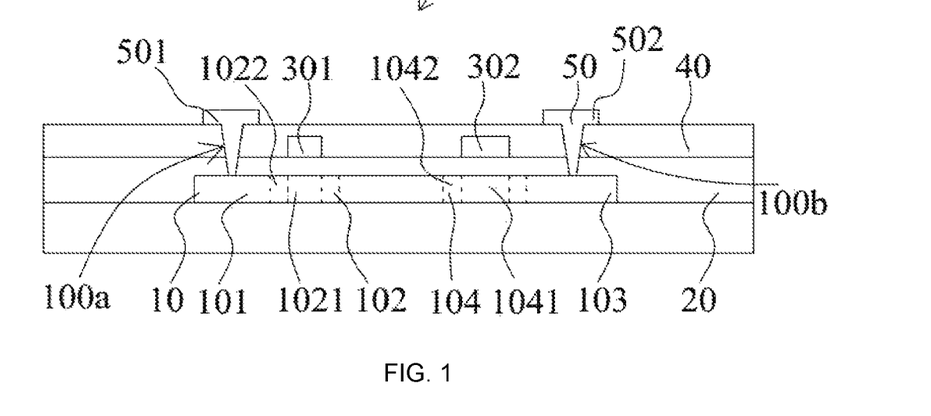
FIG. 1 is a schematic cross-sectional diagram of a thin film transistor according to an embodiment of the disclosure.
Figure 2:
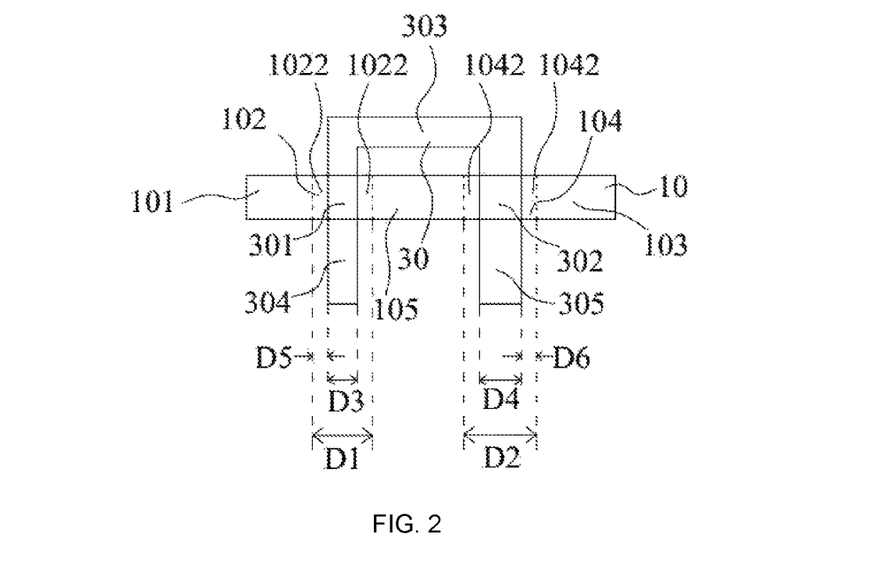
FIG. 2 is a schematic planar diagram of the thin film transistor according to FIG. 1.

Referring to FIG. 1 and FIG. 2, a schematic cross-sectional diagram of a thin film transistor according to an embodiment of the disclosure is shown in FIG. 1 and a schematic planar diagram of the thin film transistor according to FIG. 1 is shown in FIG. 2. The thin film transistor is an N-type thin film transistor. The thin film transistor 100 includes an active pattern 10, a gate insulating layer 20, a gate pattern 30, an interlayer insulating layer 40, and a source/drain electrode lead 50. It can be understood that the thin film transistor may also be a P-type thin film transistor.

In this embodiment of the disclosure, the active pattern 10 is a strip-shaped, and the active pattern 10 has a linear shape. The active pattern 10 is made of low-temperature polysilicon. In other embodiments, the material for preparing the active pattern 10 may also be a metal oxide semiconductor material, such as indium gallium zinc oxide.

In this embodiment, the active pattern 10 includes a source heavily-doped portion 101, a first transmission portion 102, a drain heavily-doped portion 103, a second transmission portion 104 and an intermediate connection portion 105. The first transmission portion 102 is adjacent to and electrically connected to the source heavily-doped portion 101, the second transmission portion 104 is adjacent to and electrically connected to the drain heavily-doped portion 103. The first transmission portion 102 and the second transmission portion 104 are disposed between the source heavily-doped portion 101 and the drain heavily-doped portion 103. The first transmission portion 102 is spaced from the second transmission portion 104, and the second transmission portion 104 and the first transmission portion 102 are connected to opposite sides of the intermediate connection portion 105, respectively. Both the first transmission portion 102 and the second transmission portion 104 are used for transmitting carriers. The intermediate connection portion 105 is also used for transmitting carriers.

In this embodiment, the first transmission portion 102 includes a first channel 1021 and at least one first lightly-doped portion 1022, and the first channel 1021 is not processed by ion implantation. Both the first lightly-doped portion 1022 and the source heavily-doped portion 101 are obtained by ion implantation of semiconductors, and the ion implantation dose of the first lightly-doped portion 1022 is less than the ion implantation dose of the source heavily-doped portion 101. The second transmission portion 104 includes a second channel 1041 and at least one second lightly-doped portion 1042, and the second channel 1041 is not processed by ion implantation. The second lightly-doped portion 1042 and the drain heavily-doped portion 103 are both obtained by ion implantation of semiconductors, and the ion implantation dose of the second lightly-doped portion 1042 is the same as that of the first lightly-doped portion 1022. The ion implantation dose of the source heavily-doped portion 101 is the same as the ion implantation dose of the drain heavily-doped portion 103. For example, the ion implantation dose of the source heavily-doped portion 101 and the ion implantation dose of the drain heavily-doped portion 103 are both $10^{14}$ ions per cubic centimeter, and the ion implantation dose of the second lightly-doped portion 1042 and the ion implantation dose of the first lightly-doped portion 1022 are both $10^{13}$ ions per cubic centimeter.

Specifically, the first transmission portion 102 includes two of the first lightly-doped portions 1022 and a first channel 1021, and the two of the first lightly-doped portions 1022 are connected to opposite sides of the first channel 1021. One first lightly-doped portion 1022 is connected between the source heavily-doped portion 101 and the first channel 1021, and the other first lightly-doped portion 1022 is connected to a side of the first channel 1021 away from the source heavily-doped portion 101. The two of the first lightly-doped portions 1022 are the same. The second transmission portion 104 includes two of the second lightly-doped portions 1042 and a second channel 1041, the two of the second lightly-doped portions 1042 are connected to opposite sides of the second channel 1041. One second lightly-doped portion 1042 is connected between the drain heavily-doped portion 103 and the second channel 1041, and the other second lightly-doped portion 1042 is connected to a side of the second channel 1041 away from the drain heavily-doped portion 103. The two of the second lightly-doped portions 1042 are the same. It can be understood that the first transmission portion 102 can include only one first lightly-doped portion 1022 and the first lightly-doped portion 1022 is disposed between the first channel 1021 and the source heavily-doped portion 101. The second transmission portion 104 can include only one second lightly-doped portion 1042 and the second lightly-doped portion 1042 is disposed between the second channel 1041 and the drain heavily-doped portion 103.

In this embodiment, in a direction in which the first transmission portion 102 directs to the source heavily-doped portion 101, the first transmission portion 102 has a first dimension D1. In a direction in which the second transmission portion 104 directs to the heavily-doped drain portion 103, the second transmission portion 104 has a second dimension D2. The first dimension D1 is different from the second dimension D2, so that when the thin film transistor is turned on, the intensity of the electric field applied to the carriers transferred by the first transmission portion 102 is different from the intensity of the electric field applied to the carriers transferred by the second transmission portion 104. When the thin film transistor is turned on, the carriers transmitted by a transmission portion corresponding to the larger one of the first dimension D1 or the second dimension D2 is subjected to smaller intensity of the electric field intensity. The bombardment effect of the carriers on the source or drain is reduced, thereby improving the damage of the bias stress to the source or the drain, and improving the stability of the thin film transistor.

Specifically, the first dimension D1 is smaller than the second dimension D2, so that the intensity of the electric field applied to the carriers during the transfer of the carriers by the second transmission portion t 104 is small. The bombardment effect of the carriers on the drain is reduced, which is beneficial to solve the problem that the drain of the thin film transistor is subjected to a bias stress that exceeds the loading when the N-type low-temperature polysilicon thin film transistor is applied to the gate driving circuit. It can be understood that the first dimension D1 can be larger than the second dimension D2 to reduce the bombardment effect of the carriers on the source.

In this embodiment, the first channel 1021 is a portion of the first transmission portion 102 that overlaps the first gate 301 along a direction of a thickness of the thin film transistor. The first channel 1021 has a third dimension D3 in a direction of the first transmission portion 102 directing to the source heavily-doped unit 101. Each of the two of the first lightly-doped portions 1022 has a fifth dimension D5. The second channel 1041 is a portion of the second transmission portion 104 that overlaps the second gate 302 along a direction of a thickness of the thin film transistor. The second channel 1041 has a fourth dimension D4 in a direction of the second transmission portion 104 directing to the drain heavily-doped unit 103. Each of the two of the second lightly-doped portions 1042 has a sixth dimension D6. The fifth dimension D5 is equal to the sixth dimension D6. The third dimension D3 is smaller than the fourth dimension D4. The first dimension D1 of the first transmission portion 102 is smaller than the second dimension D2 of the second transmission portion 104. Specifically, the third dimension D3 is greater than 0 micrometers and less than or equal to 200 micrometers, and the fourth dimension D4 is greater than 0 micrometers and less than or equal to 400 micrometers. For example, the third dimension D3 is 80 micrometers, 100 micrometers, 120 micrometers, or 180 micrometers, the fourth dimension D4 is 100 micrometers, 140 micrometers, 180 micrometers, 200 micrometers, 250 micrometers, 300 micrometers, 400 micrometers. Each of the fifth dimension D5 and the sixth dimension D6 is greater than 0 micrometers and less than or equal to 25 micrometers, for example, 10 micrometers, 15 micrometers, 20 micrometers, or 25 micrometers.

In this embodiment, the gate insulating layer 20 covers the active pattern 10. The gate insulating layer 20 is made of at least one of silicon nitride or silicon oxide. A thickness of the gate insulating layer 20 is 1000 angstroms to 2000 angstroms.

In this embodiment, the gate pattern 30 is an interdigital shape, and the gate pattern 30 is disposed on the gate insulating layer 20. The gate pattern 30 includes a first gate 301, a second gate 302, a connection section 303, a first extension section 304, and a second extension section 305. Two ends of the connection section 303 are respectively connected to the first gate 301 and the second gate 302, and the first gate 301 and the second gate 302 are disposed at a same side of the connection section 303. The first extension section 304 is connected to a side of the first gate 301 away from the connection section 303, and the second extension section 305 is connected to a side of the second gate 302 away from the connection section 303. The first gate 301 is a portion of the gate pattern 30 that overlaps the active pattern 10 and is close to the source heavily-doped portion 101, and the second gate 302 is a portion of the gate pattern 30 that overlaps the active pattern 10 and is close to the drain heavily-doped portion 103. A dimension of the first gate 301 in the direction of the first transmission portion 102 directing to the source heavily-doped portion 101 is equal to the third dimension D3 of the first channel 1021. A dimension of the second gate 302 in the direction of the second transmission unit 104 directing to the drain heavily-doped unit 103 is equal to the fourth dimension D4 of the second channel 1041. A material of the gate pattern 30 is selected from at least one of molybdenum, aluminum, titanium, copper and silver.

In this embodiment, the interlayer insulating layer 40 covers the gate pattern 30 and the gate insulating layer 20. A thickness of the interlayer insulating layer 40 is 5000-6000 angstroms, and a material of the interlayer insulating layer 40 is selected from at least one of silicon nitride and silicon oxide.

In this embodiment, the source/drain electrode lead 50 includes a source lead 501 and a drain lead 502. The source lead 501 is connected to the source heavily-doped portion 101 through a first via hole 100a penetrating the interlayer insulating layer 40 and the gate insulating layer 20. The drain lead 502 is connected to the heavily-doped drain portion 103 through a second via hole 100b penetrating the interlayer insulating layer 40 and the gate insulating layer 20. The source/drain electrode lead 50 is made of at least one material selected from molybdenum, aluminum, titanium, copper, and silver. The source lead 501 and the source heavily-doped portion 101 form a source, and the drain lead 502 and the drain heavily-doped portion 103 form a drain.

In this embodiment, in the thin film transistor, the fourth dimension D4 of the second transmission portion close to the heavily-doped drain portion is larger than the third dimension D3 of the first transmission portion close to the heavily-doped source portion, the intensity of the electric field applied to the carriers in the process of transferring the carriers by the second transmission portion is reduced, thereby reducing the bombardment effect of the carriers on the drain, and preventing the failure of the thin film transistor.

It should be noted that the technical solution in this embodiment can also be applied to a P-type thin film transistor, and the P-type thin film transistor may not have a lightly-doped portion.

Figure 3:
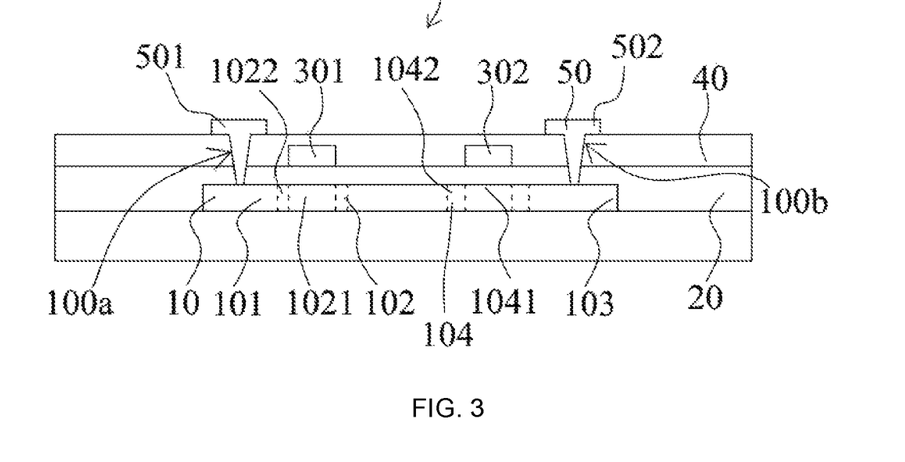
FIG. 3 is a schematic cross-sectional diagram of a thin film transistor according to another embodiment of the disclosure.
Figure 4:
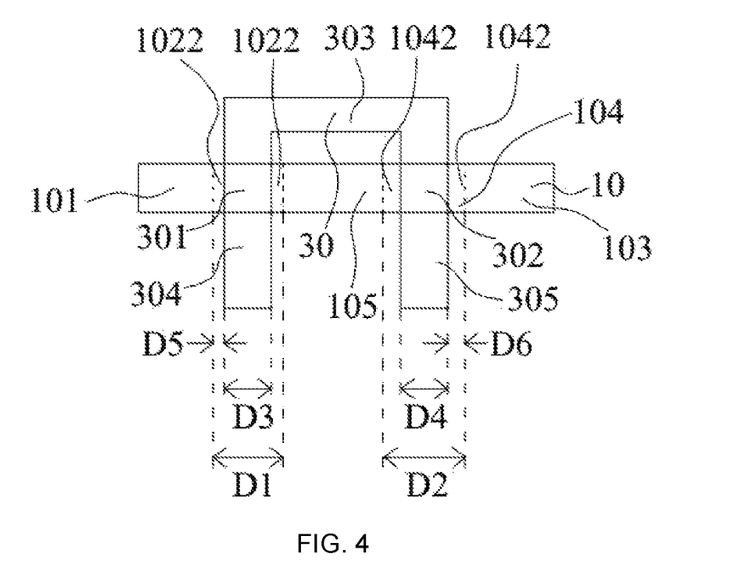
FIG. 4 is a schematic planar diagram of the thin film transistor according to FIG. 3.

Referring to FIG. 3 and FIG. 4, a schematic cross-sectional diagram of a thin film transistor according to another embodiment of the disclosure is shown in FIG. 3 and a schematic planar diagram of the thin film transistor according to FIG. 3 is shown in FIG. 4. The thin film transistor shown in FIG. 3 is basically similar to the thin film transistor shown in FIG. 4, the differences between the thin film transistors in FIG. 3 and FIG. 4 are that the third dimension D3 is equal to the fourth dimension D4 and the fifth dimension D5 is less than the sixth dimension D6, and the fifth dimension D5 is less than the fifth dimension D6. Thus, the first dimension D1 of the first transmission portion 102 is smaller than the second dimension D2 of the second transmission portion 104. The fifth dimension D5 is greater than 0 micrometers and less than or equal to 20 micrometers, and the sixth dimension D6 is greater than 0 micrometers and less than or equal to 30 micrometers. For example, the fifth dimension D5 is 15 micrometers and the sixth dimension D6 is 25 micrometers.

It should be noted that the embodiments shown in FIG. 1 and FIG. 3 can be combined. For example, when the third dimension D3 and the fourth dimension D4 are adjusted to be different, the fifth dimension D5 and the sixth dimension D6 are also adjusted to be different, so that the first dimension D1 of the first transmission portion 102 is different from the second dimension D2 of the second transmission portion 104.

Figure 5:
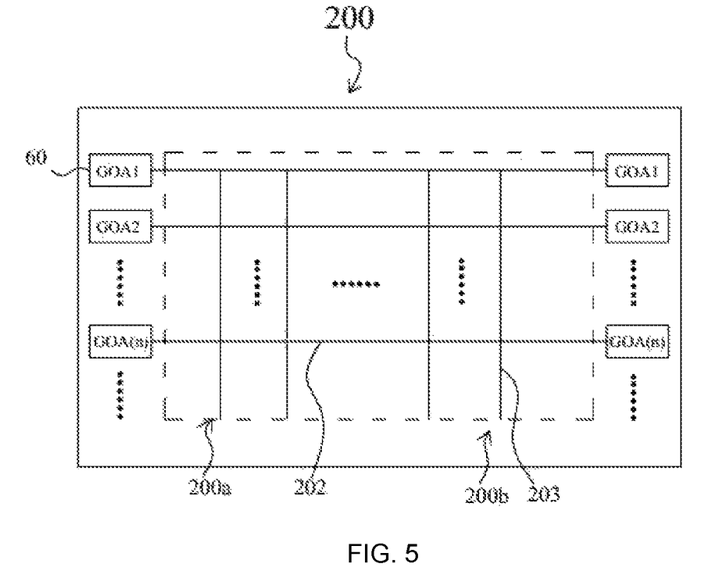
FIG. 5 is a schematic diagram of a display panel according to an embodiment of the disclosure.
Figure 6:
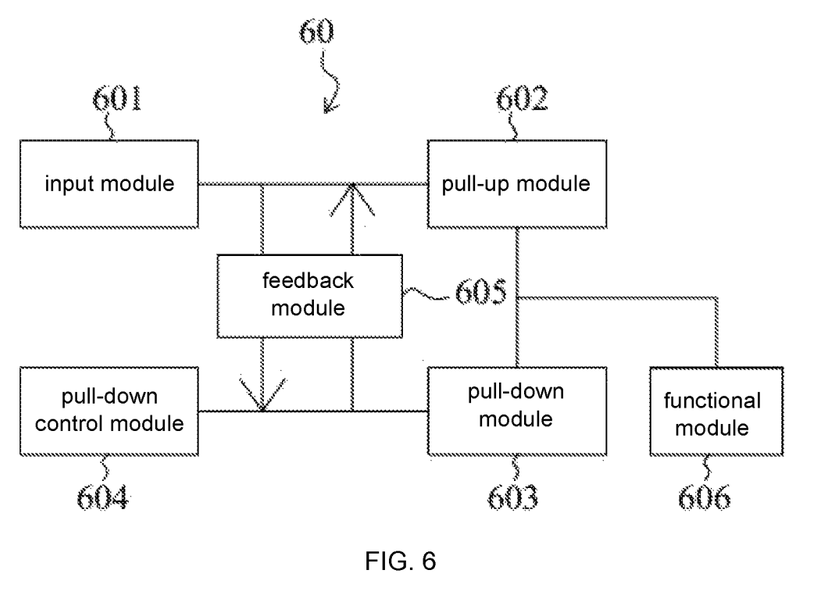
FIG. 6 is a structural schematic diagram of a gate driving circuit of the display panel according to FIG. 5.
Figure 7:
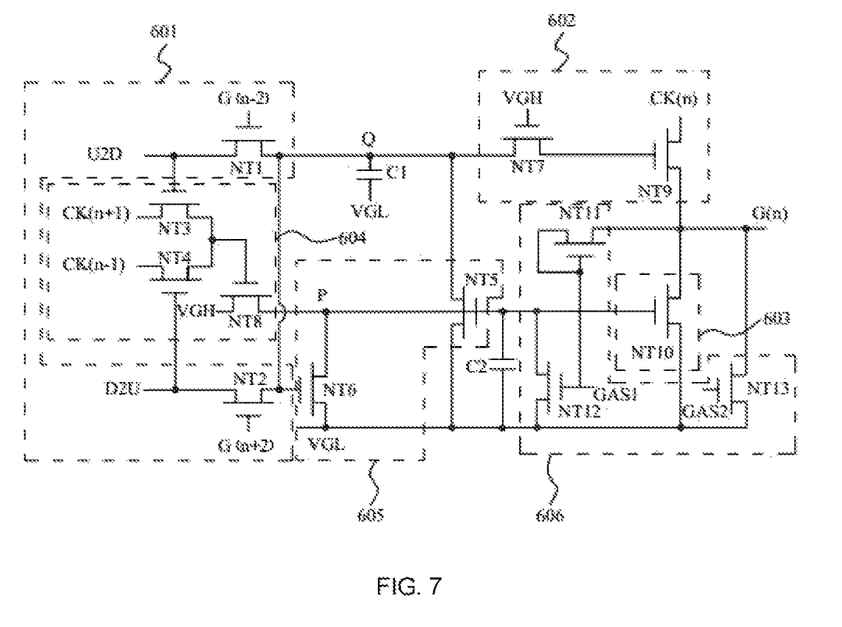
FIG. 7 is a schematic circuit diagram of the gate driving circuit according to FIG. 6.

Referring to FIG. 5 to FIG. 7, a schematic diagram of a display panel according to an embodiment of the disclosure is shown in FIG. 5, a structural schematic diagram of a gate driving circuit of the display panel according to FIG. 5 is shown in FIG. 6, and a schematic circuit diagram of the gate driving circuit according to FIG. 6 is shown in FIG. 7.

In this embodiment, the display panel 200 is a liquid crystal display panel, and the liquid crystal display panel is applied to a vehicle. The display panel 200 can be an organic light emitting diode display panel. The display panel 200 comprises a display area 200a and a peripheral area 200b.

The display panel 200 includes a scan plurality of lines 202, a plurality of data lines 203, and a plurality of gate driving units 60. The plurality of scan lines 202 and the plurality of data lines 203 are arranged in the display area 200a of the display panel 200, and the plurality of gate driving units 60 are arranged in the peripheral area 200b of the display panel 200 and disposed on opposite sides of the display area 200a. Each of the scan lines 202 is connected to two opposing gate driving units 60. The gate driving unit 60 includes the above-mentioned thin film transistors to meet the requirements of the vehicle-mounted display device for the stability of the gate driving circuit since the vehicle-mounted display device is used in a complex environment and is operated for long working hours.

In this embodiment, an n stage gate driving unit 60 includes an input module 601, a pull-up module 602, a pull-down module 603, a pull-down control module 604, a feedback module 605, and a functional module 606.

In this embodiment, the input module 601 is configured to receive a forward scanning signal U2D, a reverse scanning signal D2U, a (n−2)th stage scanning signal G(n−2), and a (n+2)th stage scanning signal G(n+2). The potential of the first node Q is adjusted in response to the (n−2)th stage scanning signal G(n−2) and the (n+2)th stage scanning signal G(n+2). Specifically, the input module 601 includes a first thin film transistor NT1 and a second thin film transistor NT2. A gate of the first thin film transistor NT1 receives the (n−2)th stage scanning signal G(n−2), a first electrode of the first thin film transistor NT1 receives the forward scanning signal U2D, and a second electrode of the first thin film transistor NT1 is connected to the first node Q. A gate of the second thin film transistor NT2 receives the (n+2)th scanning signal G(n+2), a first electrode of the second thin film transistor NT2 receives the reverse scanning signal D2U, and a second electrode of the second thin film transistor NT2 is connected to the first node Q.

In this embodiment, the pull-up module 602 is configured to pull up the n stage scanning signal G(n) according to the voltage of the first node Q. Specifically, the pull-up module 602 includes a seventh thin film transistor NT7 and a ninth thin film transistor NT9. A gate of the seventh thin film transistor NT7 receives a constant voltage high level signal VGH, a first electrode of the seventh thin film transistor NT7 is connected to the first node Q, and a second electrode of the seventh thin film transistor NT7 is connected to a gate of the ninth thin film transistor NT9. A first electrode of the ninth thin film transistor NT9 receives the first clock signal CK(n), and a second electrode of the ninth thin film transistor NT9 outputs the n stage scanning signal G(n) that is pulled up.

In this embodiment, the pull-down module 603 is configured to pull down the n stage scanning signal G(n) according to the voltage of a second node P. Specifically, the pull-down module 603 includes a tenth thin film transistor NT10. A gate of the tenth thin film transistor NT10 is connected to the second node P, a first electrode of the tenth thin film transistor NT10 receives a constant voltage low level signal VGL, a second electrode of the tenth thin film transistor NT10 is connected to the second electrode of the ninth thin film transistor NT9 to output the n stage scanning signal G(n) that is pulled down.

In this embodiment, the pull-down control module 604 is configured to receive the forward scanning signal U2D, the reverse scanning signal D2U, a second clock signal CK(n+1), and a third clock signal CK(n−1) to adjust the potential of the second node P. Specifically, the pull-down control module 604 includes a third thin film transistor NT3, a fourth thin film transistor NT4, and an eighth thin film transistor NT8. A gate of the third thin film transistor NT3 receives the forward scanning signal U2D, a first electrode of the third thin film transistor NT3 receives the second clock signal CK(n+1), and a second electrode of the third thin film transistor NT3 is connected to a gate of the eighth thin film transistor NT8. A gate of the fourth thin film transistor NT4 receives the reverse scanning signal D2U, a first electrode of the fourth thin film transistor NT4 receives the third clock signal CK(n−1), and a second electrode of the fourth thin film transistor NT4 is connected to the gate of the eighth thin film transistor NT8. The first electrode of the eighth thin film transistor NT8 is connected to the constant voltage high level VGH, and the second electrode of the eighth thin film transistor NT8 is connected to the second node P.

In this embodiment, the feedback module 605 is connected to the first node Q and the second node P. The feedback module 605 is configured to adjust the potential of the second node P according to the potential of the first node Q and adjust the potential of the first node Q according to the potential of the second node P. Specifically, the feedback module 605 includes a sixth thin film transistor NT6 and a fifth thin film transistor NT5. A gate of the fifth thin film transistor NT5 is connected to the second node P, a first electrode of the fifth thin film transistor NT5 receives the constant voltage low level signal VGL, and a second electrode of the fifth thin film transistor NT5 is connected to the first node Q. A gate of the sixth thin film transistor NT6 is connected to the first node Q, a first electrode of the sixth thin film transistor NT6 receives the constant voltage low level signal VGL, and a second electrode of the sixth thin film transistor NT6 is connected to the second node P.

In this embodiment, the function module 606 is used to pull up the n stage scanning signal G(n) when the display panel is abnormally powered off, and is also used to pull down the n stage scanning signal G(n) when the display panel is touched. The functional module 606 includes an eleventh thin film transistor NT11, a twelfth thin film transistor NT12, and a thirteenth thin film transistor NT13. A gate of the twelfth thin film transistor NT12 receives the first overall control signal GAS1, a first electrode of the twelfth thin film transistor NT12 receives the constant voltage low level signal VGL, and a second electrode of the twelfth thin film transistor nt12 is connected to the second node P. A gate of the eleventh thin film transistor NT11 receives the first overall control signal GAS1, a first electrode of the eleventh thin film transistor NT11 is connected to the gate of the eleventh thin film transistor NT11, and a second electrode of the eleventh thin film transistor NT11 is connected to the second electrode of the ninth thin film transistor NT9. A gate of the thirteenth thin film transistor NT13 is connected to a second overall control signal GAS2, a first electrode of the thirteenth thin film transistor NT13 receives a constant voltage low level signal, and a second electrode of the thirteenth thin film transistor NT13 is connected to the second electrode of the ninth thin film transistor NT9. When the display panel is displaying normally, the first overall control signal GAS1 is a constant voltage low level signal. When the display panel is abnormally powered off, the first overall control signal GAS1 is a constant voltage high level signal, so that the n stage gate driving unit outputs the n stage scanning signal G(n) that is pulled up. When the display panel is touch-driven, the second overall control signal GAS2 is a constant voltage high level signal, so that the n stage gate driving unit outputs n stage scan signal G(n) that is pulled-down.

In this embodiment, the first thin film transistor NT1 to the thirteenth thin film transistor NT13 of the gate driving circuit are all N-type low-temperature polysilicon thin film transistors. The first thin film transistor NT1 to the thirteenth thin film transistor NT13 all can be the above-mentioned thin film transistors comprising the first channel 1021 and the second channel 1041. When the low-temperature polycrystalline silicon thin film transistor with dual channels is applied to the gate driving circuit, the problem that the channel close to the drain of the thin film transistor is subjected to large bias stress is improved, and the stability of the gate driving circuit is improved. In particular, since the fifth thin film transistor NT5 is continuously subjected to the bias stress, it is benefit to the thin film transistor to improve the stability of the gate driving circuit.

The description of the above embodiments is only used to understand the method and features of this disclosure. The present disclosure has been described with preferred embodiments thereof and it is understood that many changes and modifications to the described embodiment can be carried out without departing from the scope and the spirit of the invention that is intended to be limited only by the appended claims.

What is claimed is:

1. A thin film transistor, comprising:
a gate pattern comprising a first gate and a second gate, wherein the first gate is spaced from the second gate and the first gate and the second gate are electrically connected to each other; and
an active pattern, wherein the active pattern comprises:
a source heavily-doped portion;
a first transmission portion electrically connected to the source heavily-doped portion and at least partially overlapping the first gate, wherein the first transmission portion has a first dimension in a direction of the first transmission portion towards the source heavily-doped portion;
a drain heavily-doped portion; and
a second transmission portion electrically connected to the drain heavily-doped portion and at least partially overlapping the second gate, wherein the second transmission portion has a second dimension in a direction of the second transmission portion towards the drain heavily-doped portion;
wherein the first transmission portion and the second transmission portion are both disposed between the source heavily-doped portion and the drain heavily-doped portion, the first transmission portion is spaced from the second transmission portion, and the first dimension is smaller than the second dimension.

2. The thin film transistor according to claim 1, wherein the first transmission portion comprises a first channel, the first channel is a portion of the first transmission portion that overlaps the first gate, and the first channel has a third dimension in the direction of the first transmission portion towards the source heavily-doped portion;
wherein the second transmission portion comprises a second channel, the second channel is a portion of the second transmission portion that overlaps the second gate, and the second channel has a fourth dimension in the direction of the second transmission portion towards the drain heavily-doped portion; and
wherein the third dimension is smaller than the fourth dimension.

3. The thin film transistor according to claim 1, wherein the first transmission portion comprises at least one first lightly-doped portion, the at least one first lightly-doped portion has a fifth dimension in the direction of the first transmission portion towards the source heavily-doped portion;
wherein the second transmission portion comprises at least one second lightly-doped portion, the at least one second lightly-doped portion has a sixth dimension in the direction of the second transmission portion towards the drain heavily-doped portion; and
wherein the fifth dimension is smaller than the sixth dimension.

4. The thin film transistor according to claim 3, wherein the first transmission portion comprises two of the first lightly-doped portions and the first channel, and the two of the first lightly-doped portions are connected to opposite sides of the first channel, respectively;
wherein the second transmission portion comprises two of the second lightly-doped portions and the second channel, and the two of the second lightly-doped portions are connected to opposite sides of the second channel, respectively; and
wherein the active pattern further comprises an intermediate connection portion, and the first transmission portion and the second transmission portion are connected to opposite sides of the intermediate connection portion, respectively.

5. The thin film transistor according to claim 1, wherein the active pattern has a linear shape.

6. The thin film transistor according to claim 1, wherein the gate pattern further comprises a connection section, both ends of the connection section are connected to the first gate and the second gate, respectively, and the first gate and the second gate are disposed at a same side of the connection section.

7. A display panel, wherein the display panel comprises a thin film transistor according to claim 1.

8. The display panel according to claim 7, wherein the display panel comprises a gate driving circuit, and the gate driving circuit comprises the thin film transistor.

9. A thin film transistor, comprising:
a gate pattern comprising a first gate and a second gate, wherein the first gate is spaced from the second gate and the first gate and the second gate are electrically connected to each other; and
an active pattern, wherein the active pattern comprises:
a source heavily-doped portion;
a first transmission portion electrically connected to the source heavily-doped portion and at least partially overlapping the first gate;
a drain heavily-doped portion; and
a second transmission portion electrically connected to the drain heavily-doped portion and at least partially overlapping the second gate;
wherein the first transmission portion and the second transmission portion are both disposed between the source heavily-doped portion and the drain heavily-doped portion, the first transmission portion is spaced from the second transmission portion;
wherein when the thin film transistor is turned on, an intensity of an electric field applied to carriers transmitted by the first transmission portion is different from an intensity of an electric field applied to carriers transmitted by the second transmission portion,
wherein the first transmission portion has a first dimension in a direction of the first transmission portion towards the source heavily-doped portion;
wherein the second transmission portion has a second dimension in a direction of the second transmission portion towards the drain heavily-doped portion; and
wherein the first dimension is smaller than the second dimension.

10. The thin film transistor according to claim 9, wherein the first transmission portion comprises a first channel, the first channel is a portion of the first transmission portion that overlaps the first gate, and the first channel has a third dimension in the direction of the first transmission portion towards the source heavily-doped portion;
wherein the second transmission portion comprises a second channel, the second channel is a portion of the second transmission portion that overlaps the second gate, and the second channel has a fourth dimension in the direction of the second transmission portion towards the drain heavily-doped portion; and
wherein the third dimension is smaller than the fourth dimension.

11. The thin film transistor according to claim 9, wherein the first transmission portion comprises at least one first lightly-doped portion, the at least one first lightly-doped portion has a fifth dimension in the direction of the first transmission portion towards the source heavily-doped portion;

wherein the second transmission portion comprises at least one second lightly-doped portion, the at least one second lightly-doped portion has a sixth dimension in the direction of the second transmission portion towards the drain heavily-doped portion; and  wherein the fifth dimension is smaller than the sixth dimension.

12. The thin film transistor according to claim 11, wherein the first transmission portion comprises two of the first lightly-doped portions and the first channel, and the two of the first lightly-doped portions are connected to opposite sides of the first channel, respectively;

wherein the second transmission portion comprises two of the second lightly-doped portions and the second channel, and the two of the second lightly-doped portions are connected to opposite sides of the second channel, respectively; and  wherein the active pattern further comprises an intermediate connection portion, and the first transmission portion and the second transmission portion are connected to opposite sides of the intermediate connection portion, respectively.

13. The thin film transistor according to claim 9, wherein the active pattern has a linear shape.

14. The thin film transistor according to claim 9, wherein the gate pattern further comprises a connection section, both ends of the connection section are connected to the first gate and the second gate, respectively, and the first gate and the second gate are disposed at a same side of the connection section.

* * * * *